(12) United States Patent
Matsumoto

(10) Patent No.: US 7,049,637 B2
(45) Date of Patent: May 23, 2006

(54) ORGANIC EL PANEL

(75) Inventor: Shoichiro Matsumoto, Ogaki (JP)

(73) Assignee: Sanyo Electric Co., Ltd. (JP)

( * ) Notice: Subject to any disclaimer, the term of this patent is extended or adjusted under 35 U.S.C. 154(b) by 108 days.

(21) Appl. No.: 10/627,148

(22) Filed: Jul. 25, 2003

(65) Prior Publication Data

US 2004/0159845 A1 Aug. 19, 2004

(30) Foreign Application Priority Data

Jul. 26, 2002 (JP) .............................. 2002-218862

(51) Int. Cl.
*H01L 27/15* (2006.01)

(52) U.S. Cl. .......................... 257/83; 257/40; 257/252; 257/257; 257/258

(58) Field of Classification Search ........ 257/252–254, 257/257–258
See application file for complete search history.

(56) References Cited

U.S. PATENT DOCUMENTS 6,420,758 B1 * 7/2002 Nakajima .................... 257/350

FOREIGN PATENT DOCUMENTS

EP 1193676 A2 9/2001

* cited by examiner

*Primary Examiner*—Wai-Sing Louie
(74) *Attorney, Agent, or Firm*—Cantor Colburn LLP

(57) ABSTRACT

A gate length L of a second TFT (21) is set longer than the gate length L of a peripheral TFT. This arrangement makes it possible to accurately control even a small current, using the second TFT (21).

9 Claims, 5 Drawing Sheets

ORGANIC EL PANEL

BACKGROUND OF THE INVENTION

1. Field of the Invention

The present invention relates to an organic EL panel having a plurality of organic EL elements arranged in a matrix.

2. Description of the Related Art

Organic EL display panels are one type of conventionally known flat display panel. Organic EL display panels differ from liquid crystal display panels (LCDs) in that they are self-emissive, and are very much expected to come into wide use as bright and easy-to-view flat display panels.

A typical organic EL display comprises a number of organic EL elements as pixels arranged in a matrix. Organic EL elements, similar to the elements in LCDs, can be driven using either a passive or active method. Also similar to LCD elements, an active matrix method, in which a switch element is provided for each pixel and turning on and off of each switch element is controlled to thereby control display of each element, is preferred because a screen image with more finer detail can be achieved with an active matrix method, rather than a passive method in which a switch element is not provided for each pixel.

FIG. 4 shows an example structure of a pixel circuit in an organic EL panel which utilizes a conventional thin film transistor (TFT). The organic EL panel is configured by arranging these pixels in a matrix.

A gate line GL, which runs in the row direction, is connected to the gate of a first TFT 10, which is an N-channel TFT for selection by the gate line GL. The first TFT 10 is further connected at its drain to a data line DL, which runs in the column direction, and at its source to a storage capacitor CS. The storage capacitor CS is connected at its other end to a capacitor line SL. The joint between the source of the first TFT 10 and the capacitor CS is connected to the gate of a second TFT 21, which is a p-channel TFT. The second TFT 21 is further connected at its source to a power source line VL and at its drain to an organic EL element 50. The organic EL element 50 is further connected at its other end to a cathode source VC.

A gate line GL is provided for each horizontal line of pixels, and is configured to be set at a high level by the vertical drive circuit 60. That is, the respective gate lines GL are sequentially configured to be set at an H level, to thereby turn on all of the first TFTs 10 which are connected at their gates to these gate lines GL set at an H level.

Meanwhile, the data line DL is connected to a horizontal drive circuit 62 which couples the video signal line and the data line DL at timing when a corresponding displaying video signal (data) is supplied to the video signal line.

As described above, the first TFT 10 is turned on in response to a gate line GL is set at an H level, and data on the data line DL is held in the storage capacitor CS. Subsequently, the second TFT 21 is turned on according to the data (potential) held in the storage capacitor CS, and, while the second TFT 21 remains in an ON state, a current is caused to flow into the organic EL element EL for light emission.

As shown in FIG. 5, the vertical drive circuit 60 for controlling the gate line GL and the horizontal drive circuit 62 for controlling the data line DL are provided near the periphery of the display area where organic EL elements are arranged in a matrix. A power source and various signals which are necessary for the organic EL panel are supplied via an interface 64, which is also provided near the periphery of the display area.

Here, the second TFT 21 must be able to provide stable supply of a current over a wide range according to the voltage held in the capacitor. In addition, minimization of the required current and of power consumption are desired.

In order to satisfy these requirements, one solution may be to set a low power source voltage for the second TFT 21. Although this can reduce the current required in the second TFT while maintaining a range of adjustment for the current, lowpower voltage for the second TFT 21 may also cause a problem of unsuccessful control of the amount of emitted light due to variations in characteristics of the organic EL elements and the second TFTs 21.

SUMMARY OF THE INVENTION

According to the present invention, an operation of the second TFT of the organic EL panel can be maintained at a sufficient level.

According to the present invention, a longer gate length is ensured for the drive transistor. This makes it possible to reduce the current to be supplied from the drive transistor to an organic EL element, and to attain current control over a wider range.

DESCRIPTION OF THE PREFERRED EMBODIMENT

In the following, a preferred embodiment of the present invention will be described while referring to the accompanying drawings.

Figure 1:
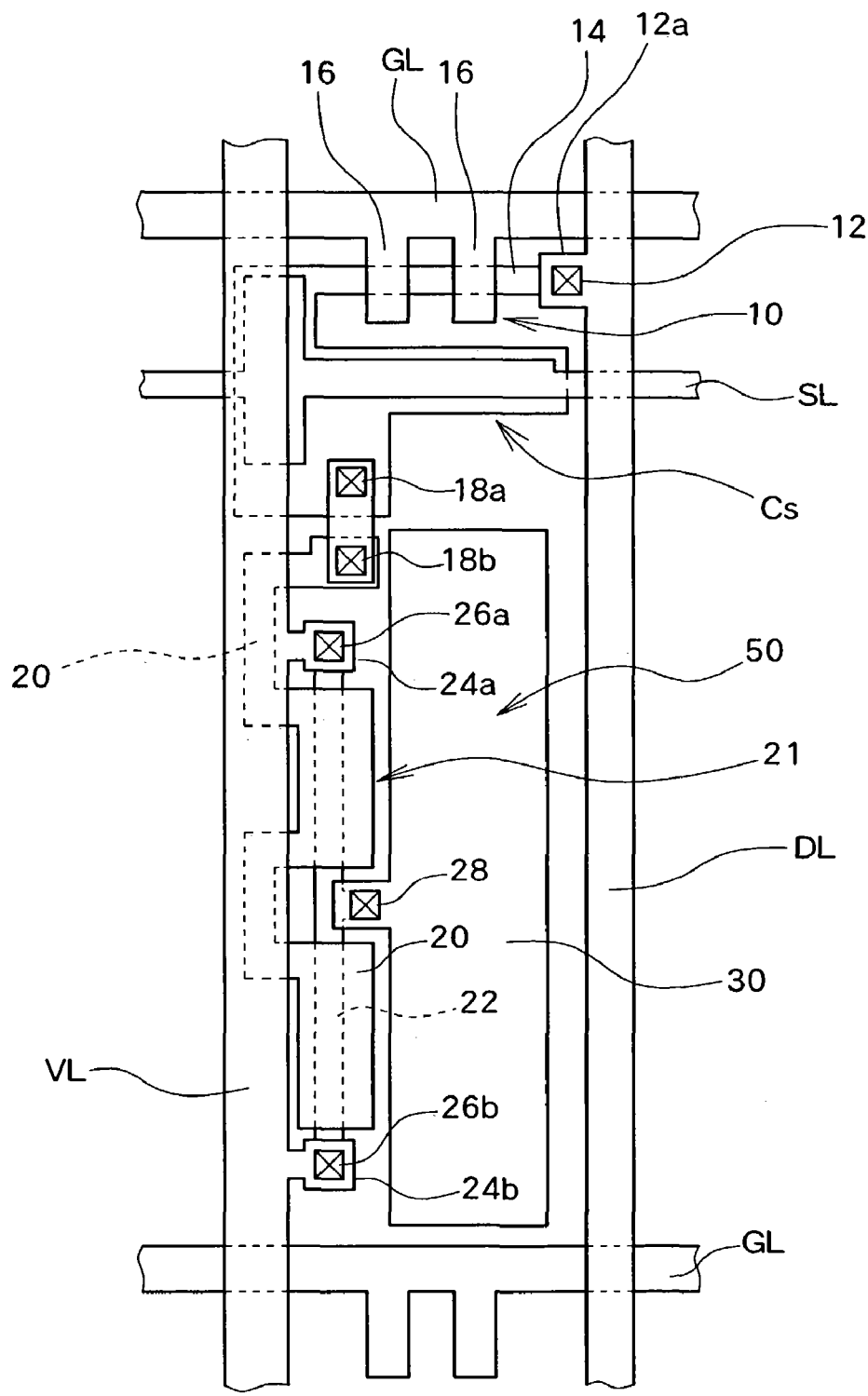
FIG. 1 is a diagram showing a structure of a pixel having a second TFT in an embodiment of the present invention.
Figure 4:
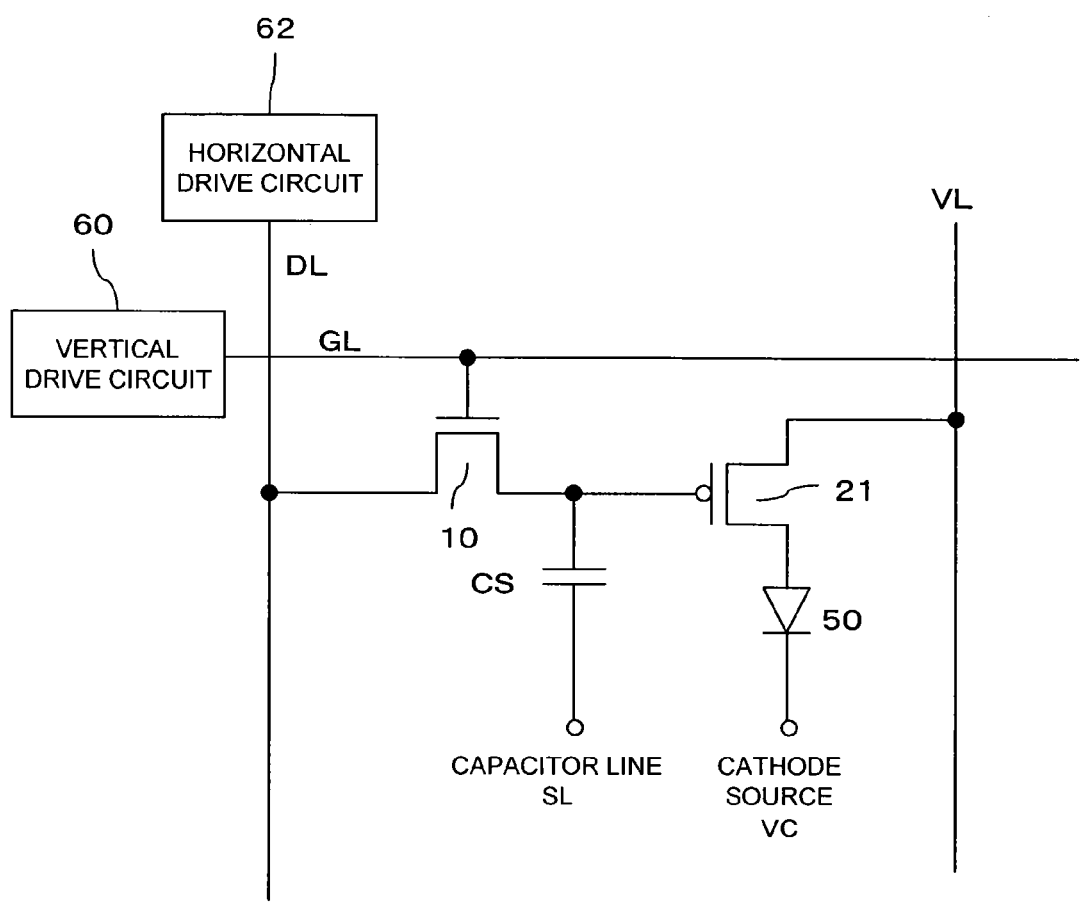
FIG. 4 is a diagram showing a structure of a pixel circuit.
Figure 5:
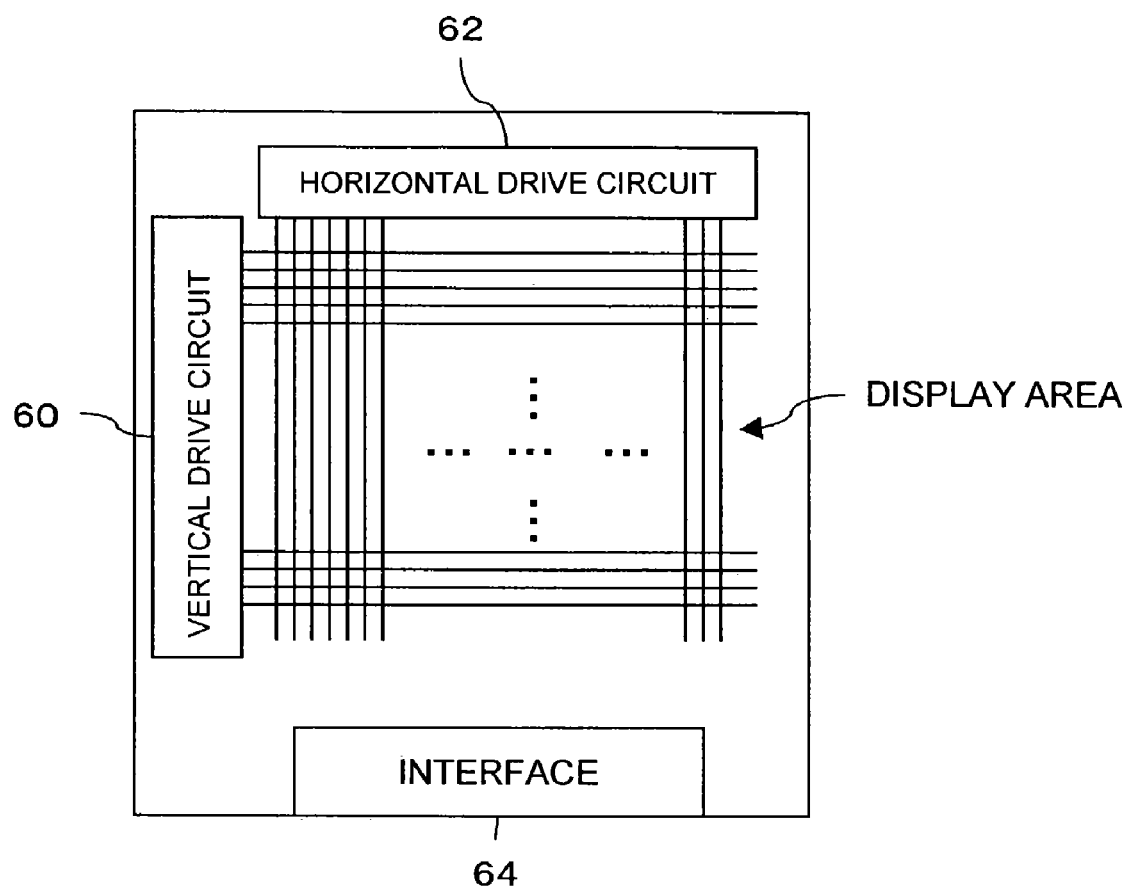
FIG. 5 is a diagram showing a complete structure of an organic EL panel.

FIG. 1 is a schematic plan view showing a structure of a pixel portion of a circuit in this embodiment. Note that this circuit structure is identical to that of FIG. 4 described above.

A data line DL and a power source line VL are provided in the column (vertical) direction with a predetermined interval, while a gate line GL is provided in the row (horizontal) direction with a predetermined interval. These data line DL, gate line GL, and power source line VL together define a pixel region where first and second TFTs (drive transistors) 10, 21, a capacitor CS, and an organic EL element 50 are provided.

The data line DL is made of, for example, aluminum, to which the drain of the first TFT 10 is connected via a contact 12. The contact 12 is formed on a projection 12a from the data line DL, which extends inward the associated pixel region in an area upper right (in the drawing) of the associated pixel region.

The first TFT 10 has a semiconductor layer 14 which is made of polysilicon and formed on a glass substrate. One end of the semiconductor layer 14 extends into below the projection 12a of the data line DL, so that the end is connected to the projection 12a through the contact 12, which extends in the thickness direction of the structure.

In the first TFT 10, the region of the semiconductor layer 14 contacted by the contact 12 constitutes a drain region. The semiconductor layer 14 extends in the horizontal direction, and the gate line GL, which may be made of, for example, Mo, Cr, or the like, projects at two points to above the semiconductor layer 14, that is, downward in the drawing, or inward the associated pixel region, so that the two projected portions of the gate line GL constitute two gate electrodes 16 which are formed via a gate insulating film on the semiconductor layer 14. The portions of the semiconductor layer 14, located below the gate electrodes 16 constitute channel regions. The end of the semiconductor layer 14, opposite from the end which constitutes the drain region constitutes a source region.

The semiconductor layer 14 further extends (downward in the drawing) and constitutes an electrode of the capacitor CS on its one side. The capacitor CS comprises the semiconductor layer 14 and a capacitor electrode, which is a part of the capacitor line SL and situated so as to oppose to the extended portion of the semiconductor layer 14 via a dielectric layer. The capacitor line SL may also be made of, for example, Mo, Cr, or the like.

The semiconductor layer 14, which is made of polysilicon, further extends downward (in the drawing) from the electrode portion of the capacitor CS and connected, via a pair of contacts 18a, 18b, which are connected to each other using an aluminum material, to the gate electrode 20 of the second TFT 21. The gate electrode 20 may be formed using, for example, Mo.

Here, the second TFT 21 has a semiconductor layer 22. Both ends of the semiconductor layer 22 constitute drain regions connected to the power source line VL. The central portion of the semiconductor layer 22 constitutes a source region connected to the organic EL element 50. The portions of the semiconductor layer 22 which intervene between the respective drain regions and the source region and above which gate electrodes 20 are formed via a gate insulating film, constitute channel regions.

The semiconductor layer 22, which constitutes the second TFT 21, has a longitudinal shape extending along the power source line VL. The power line VL projects towards above (in the thickness direction of the structure) the drain regions in the pair of upper and lower (in the drawing) ends of the semiconductor layer 22. The projected portions of the power line VL constitute a pair of projections 24a, 24b, where the contacts 26am, 26b are respectively formed for connecting the power source line VL and the pair of drain regions of the second TFT 21.

Figure 2A:
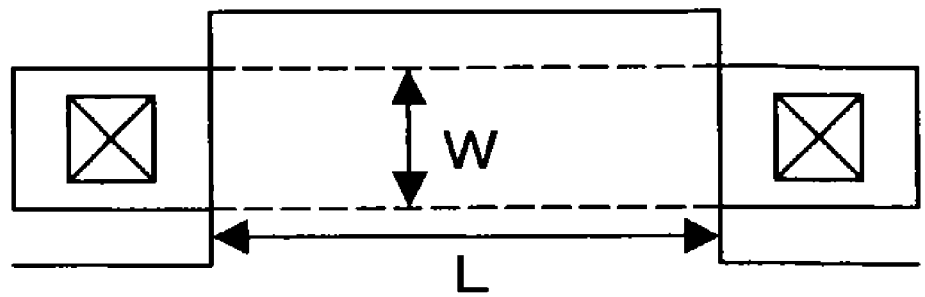
FIGS. 2A and 2B are diagrams showing a structure of the second TFT and a peripheral TFT.
Figure 2B:
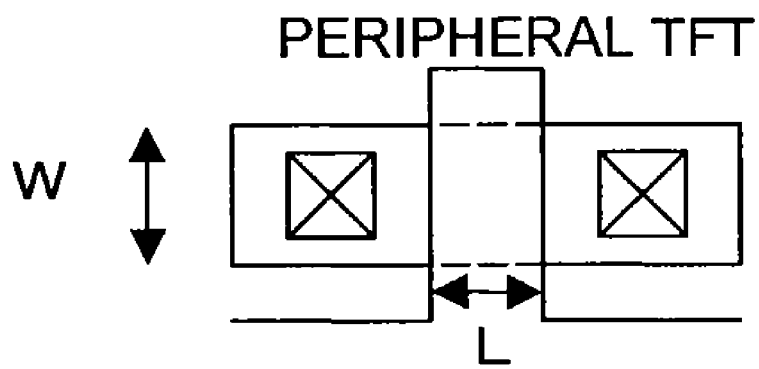

Here, as schematically shown in FIGS. 2A and 2B, a longer gate length L is ensured for the second TFT 21, as compared to that of a peripheral TFT (a peripheral transistor) which is used as a peripheral drive circuit. It should be noted that the peripheral TFT may be a TFT which constitutes a shift register of a vertical or horizontal drive circuit for controlling selection of a gate line GL or a data line DL. A variety of types of TFTs can be used as a peripheral circuit, all of which are formed through basically identical processing and are finished to basically the same size.

The peripheral TFT is used for a switching operation, and operates at a high speed by utilizing a power source (Vdd) which is different from that for the second TFT. Therefore, a shorter gate length L is preferred.

Meanwhile, the second TFT 21 is used to control an amount of current to be supplied to the organic EL element 50 to thereby control display luminous, through control of a gate voltage of itself. Therefore, the second TFT 21 must accurately control the amount current in a predetermined range. In this embodiment, a longer gate length L of the second TFT 21 is ensured, so that reliable control of a current amount can be achieved by controlling the gate voltage of the second TFF.

Although a longer gate length L generally results in reduced operation speed of a TFT, because the second TFT 21 in this configuration utilizes the voltage held in the assistant capacitor CS to continue supplying a constant amount of current for one frame period and therefore does not need a high speed switching, the gate length L of the second TFT 21 can be set longer and preferable proprieties can be attained.

Note that FIG. 2 shows only one second TFT 21 among the two second TFTs arranged in parallel.

Here, the following conditions must be satisfied when setting the gate length of the second TFT 21.

(i) A current Ids, which flows through the second TFT of the pixel, is a small current compared to a current flowing through a peripheral TFT, and comprises an on current (Ion: shown in white) and an off current (Ioff: shown in black) depending on an organic material of the organic EL element. For the current Ids, Ion/Ioff$\geq$100 must be held in order to attain suitable tone displaying.

(ii) In order to achieve such current control over a wide range using a second TFT 21 for driving an organic EL element made of a currently available organic material, the voltage of the power source line VL must have a predetermined minimum power source voltage Pvddmin and the gate length L must have the shortest length Lmin in consideration of variation in characteristics and deterioration in characteristics with the lapse of time. In addition, with the maximum power source voltage Pvddmax and the longest gate length Lmax, an on current Ion can be caused.

Figure 3:
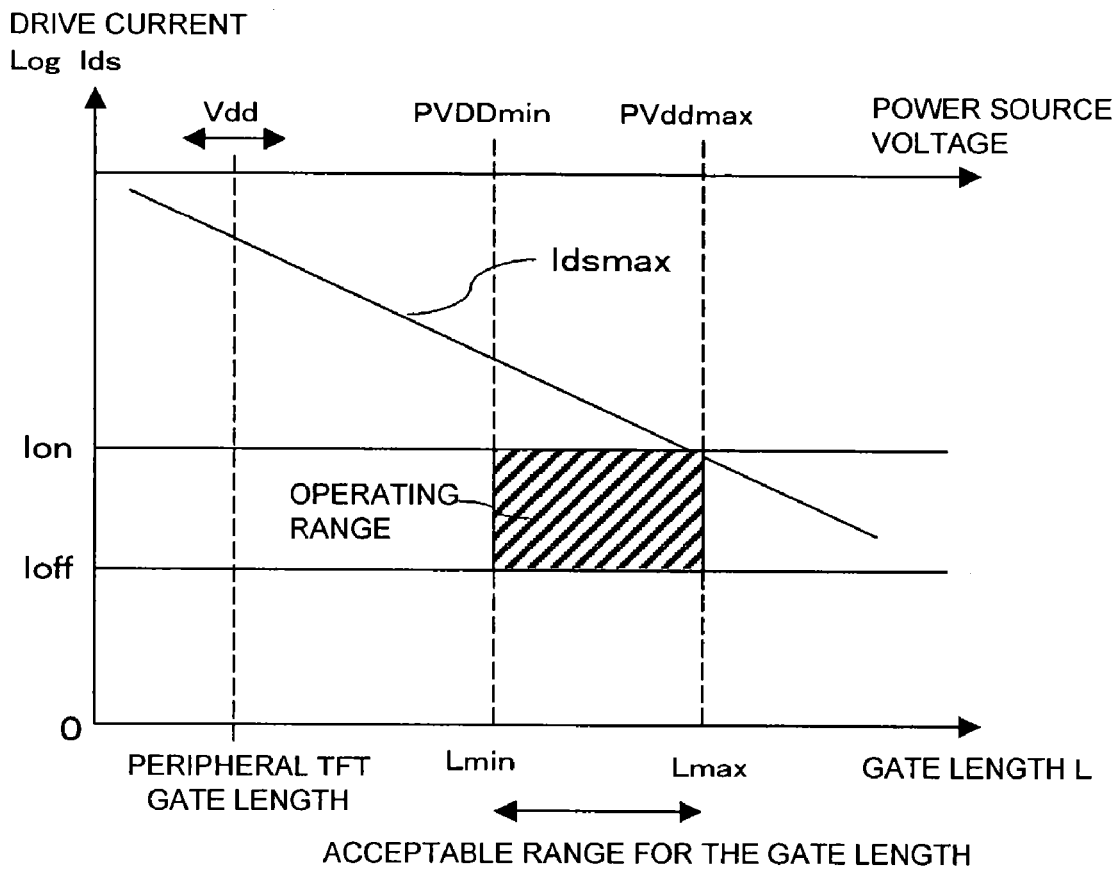
FIG. 3 is a diagram showing a suitable gate length.

In order to satisfy the above-described conditions, the second TFT 21 must operate within an effective operating range, such as that indicated by the diagonal lines in FIG. 3.

For this purpose, there is an acceptable range for an appropriate gate length L. The appropriate gate length L is always longer than an appropriate gate length for a peripheral transistor. This arrangement makes it possible to attain preferable tone control, using the second TFT 21 in this embodiment, and to maintain a sufficiently high speed operation for the peripheral transistor. Note that the peripheral transistor operates using a power source Vdd and the maximum drive current Idsmax which is determined by the gate voltage.

Further, in order to ensure an ample amount of current for the peripheral transistor and a current Ion for the second drive TFT 21, the peripheral transistor and the second drive TFT 21 must have substantially identical gate width W and the (gate length L)/(gate width W) of the second TFT 21 must be set larger than that of the peripheral circuit.

It should be noted that the (gate width W)/(gate length L) is preferably about (5 to 500 µm)/(1 to 10 µm) for the peripheral transistor and about (5 to 10 µm)/(10 to 100 µm) for the second drive TFT.

That is, the gate width W of the peripheral transistor is set at a value selected from a range between 5 and 500 µm and the gate length L thereof is set at a value selected from a range between 5 and 10 µm. The gate width W of the second TFT is set at a value selected from a range between 5 and 10 µm and the gate length L thereof is set at a value selected from the ranges of a range between 10 and 100 µm.

As described above, in this embodiment, the gate length of a drive transistor is set large. Alternatively, a ratio between a gate width and a gate length of a drive transistor is set small. This makes it possible to reduce an amount of current to be supplied to an organic EL element, and to reliably control the amount of current over a wide range.

What is claimed is:

1. An organic EL panel having a plurality of organic EL elements arranged in a matrix, comprising:
   a drive transistor provided to each of the plurality of organic EL elements, for controlling a drive current to be supplied to a corresponding organic EL element; and
   a peripheral transistor disposed within a peripheral circuit which is formed outside of a display area where the plurality of organic EL elements are arranged, for outputting a signal for controlling the drive transistor,
   wherein a gate length of the drive transistor is set longer than a gate length of the peripheral transistor.

2. The organic EL panel according to claim 1, wherein the gate length of the peripheral transistor is set to a value between 1 and 10 µm.

3. The organic EL panel according to claim 1, wherein the gate length of the drive transistor is set to a value between 10 and 100 µm.

4. The organic EL panel according to claim 1, wherein a gate width of the drive transistor and a gate width of the peripheral transistor are set to the same value.

5. An organic EL panel having a plurality of organic EL elements arranged in a matrix, comprising:
   a drive transistor provided to each of the plurality of organic EL elements, for controlling a drive current to be supplied to a corresponding organic EL element; and
   a peripheral transistor disposed within a peripheral circuit which is formed outside of a display area where the plurality of organic EL elements are arranged, for outputting a signal for controlling the drive transistor,
   wherein (a gate length L)/(a gate width W) of the drive transistor is set larger than (a gate length L)/(a gate width W) of the peripheral transistor.

6. The organic EL panel according to claim 5, wherein the gate length of the peripheral transistor is set to a value between 1 and 10 µm.

7. The organic EL panel according to claim 5, wherein the gate length of the drive transistor is set to a value between 10 and 100 µm.

8. The organic EL panel according to claim 5, wherein the gate width of the peripheral transistor is set to a value between 5 and 500 µm.

9. The organic EL panel according to claim 5, wherein the gate width of the drive transistor is set to a value between 5 and 10 µm.

* * * * *